United States Patent
Chang

(10) Patent No.: US 7,297,285 B2
(45) Date of Patent: Nov. 20, 2007

(54) MANUFACTURING PROCESS OF EMBOSS TYPE FLEXIBLE OR RIGID PRINTED CIRCUIT BOARD

(76) Inventor: Roger Chang, 10F, No. 17, Lane 15, Painien 2nd St., Lungtang Hsiang, Taoyuan Hsien (TW)

( * ) Notice: Subject to any disclaimer, the term of this patent is extended or adjusted under 35 U.S.C. 154(b) by 243 days.

(21) Appl. No.: 11/197,332

(22) Filed: Aug. 5, 2005

(65) Prior Publication Data

US 2007/0029204 A1 Feb. 8, 2007

(51) Int. Cl.
*H01B 13/00* (2006.01)

(52) U.S. Cl. .............. 216/13; 216/17; 216/18; 216/20; 216/78

(58) Field of Classification Search ........... 216/13, 216/17, 18, 20, 78
See application file for complete search history.

(56) References Cited

U.S. PATENT DOCUMENTS

| | | | | |
|---|---|---|---|---|
| 5,813,870 | A * | 9/1998 | Gaynes et al. ............ | 439/91 |
| 6,240,636 | B1 * | 6/2001 | Asai et al. ................. | 29/852 |
| 6,419,149 | B1 * | 7/2002 | Yano et al. ............. | 228/235.1 |
| 6,815,709 | B2 * | 11/2004 | Clothier et al. ............ | 257/40 |
| 2002/0081530 | A1 * | 6/2002 | Yamamoto et al. ......... | 430/313 |
| 2004/0124533 | A1 * | 7/2004 | Keser et al. ............... | 257/758 |

\* cited by examiner

*Primary Examiner*—Binh X. Tran
(74) *Attorney, Agent, or Firm*—Posz Law Group, PLC; R. Eugene Varndell, Jr.

(57) ABSTRACT

A manufacturing process of an emboss type flexible or rigid printed circuit board includes multiple steps. First, a layer of dry film is applied to a layer of copper foil. Then a circuit pattern is formed on the copper foil through photolithography processes. An etching stop layer is electroplated on the circuit pattern. The etching stop layer is then electroplated with copper. The copper foil is softened by a high temperature process after removing the dry film. Then the layer of the copper foil is etched after coating with an organic surface layer and the organic surface layer is solidified.

13 Claims, 2 Drawing Sheets

MANUFACTURING PROCESS OF EMBOSS TYPE FLEXIBLE OR RIGID PRINTED CIRCUIT BOARD

BACKGROUND OF THE INVENTION

1. Field of the Invention

The invention relates in general to a manufacturing process of an emboss type flexible or rigid printed circuit board, and more particularly to a structure design of an emboss type flexible printed circuit board wherein a circuit is directly formed on a carrier.

2. Description of the Related Art

Semiconductors are manufactured into a huge variety of electronic products. A conventional manufacturing technique for the semiconductors is to fabricate multiple pre-manufactured grain-shaped chips into semiconductor elements having external contacts or pins. Then the contacts or the pins of the semiconductor elements are soldered to be coupled with a circuit on a circuit board, so as to manufacture the electronic products with predetermined functions.

However, as the overwhelming trend in electronic products is towards developing portable and compact devices, a surface adhering technique is applied to secure the semiconductor elements to be coupled to the circuit board. Moreover, when fabricating the circuit board by using the surface adhering technique, excessive cost is inevitable due to high-priced raw materials. Hence the consumers have to decide between paying more for the state of the art products or choosing lower priced but less attractive products. Further, it is difficult for purchasing departments of companies to control and even predict the prices of those raw materials, especially when the material purchase orders must be signed long before the products can be manufactured.

SUMMARY OF THE INVENTION

It is therefore an objective of the present invention to provide a manufacturing process of an emboss type flexible or rigid printed circuit board, which can minimize the disadvantage of high-priced raw materials. The manufacturing process of an embedded type flexible or rigid printed circuit board of the present invention can produce a circuit board with the same effectiveness as the conventional circuit board fabricated by the high-cost surface adhesive technique.

According to another objective of the present invention, an entirely different application structure can be developed by switching the steps in the manufacturing process of the present invention.

In order to achieve the aforesaid objectives, the manufacturing process for an emboss type flexible or rigid printed circuit board of the present invention includes multiple steps as follows.

First, a layer of copper foil is prepared and the layer of the copper foil is coated with a layer of dry film or liquid type photo resist. A circuit is formed after exposure and development. An etching stop layer of 3-10 μm depth is electroplated on the circuit. The etching stop layer is further electroplated with copper. Then the dry film or photo resist is removed. Next, the copper foil is heated to become soft. The copper foil is coated with an organic surface layer, whereafter the organic surface layer is solidified such as by heating or UV. Then, the layer of the copper foil is etched, and the etching stop layer is also removed. Finally, the circuit is transferred to be emboss into the organic material, and subsequently a surface of the circuit is processed with isolation coating, exposure, development, and a contact point surface process, so as to complete functionality of the circuit board.

The layer of the copper foil can be completely removed in the aforesaid step of etching the copper foil.

The layer of the copper foil can be partially removed in the aforesaid step of etching the copper foil.

With the aforesaid steps, the manufacturing process of the embedded type flexible printed circuit board of the present invention does not need use of a conventional carrier, so as to economize on the cost and further enhance competitiveness.

DETAILED DESCRIPTION OF THE INVENTION

Figure 1:
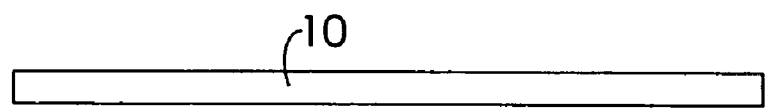
FIG. 1 shows a side view of a copper foil in a manufacturing process of the present invention.
Figure 2:
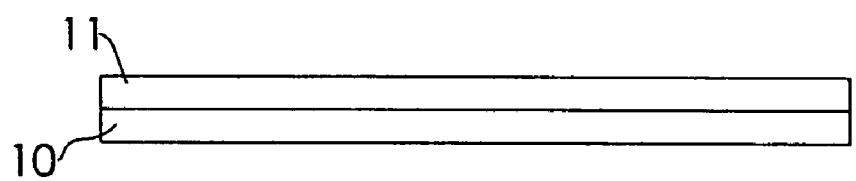
FIG. 2 shows a diagram wherein a dry film is added to a copper foil in the present invention.
Figure 3:
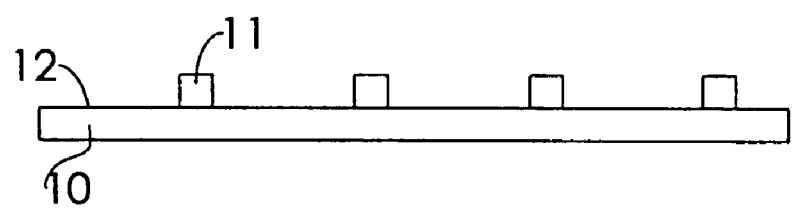
FIG. 3 shows a diagram wherein a part of the dry film is removed to make a circuit exposed in the present invention.
Figure 4:
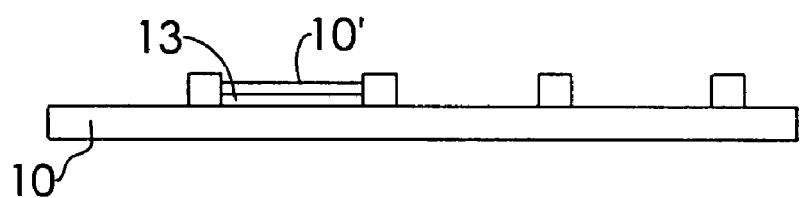
FIG. 4 shows a structure diagram wherein an etching stop layer is electroplated on the circuit and also a layer of copper is added on the etching stop layer.
Figure 5:
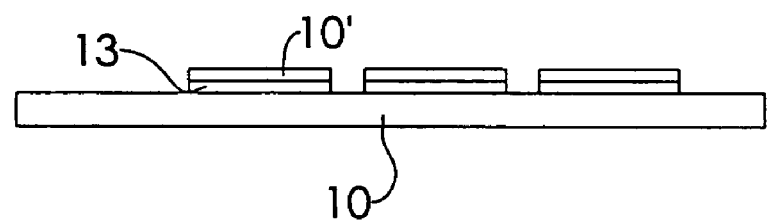
FIG. 5 shows a diagram wherein the dry film is removed and the circuit with copper is softened by application of a high temperature.
Figure 6:
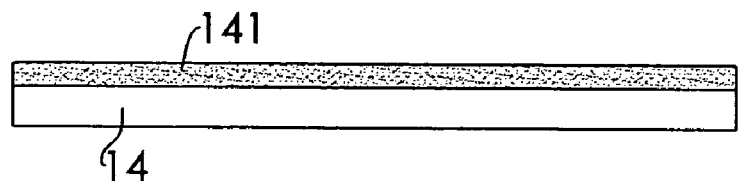
FIG. 6 shows a diagram wherein an organic surface layer is formed.

According to the aforesaid description of the manufacturing process of the emboss type flexible printed circuit board of the present invention, details are illustrated as follows.

Referring to FIG. 1 to FIG. 9A, a first step is to prepare a layer of copper foil 10 and the layer of the copper foil 10 is coated with a layer of dry film 11. A circuit pattern 12 is formed on the layer of the copper foil 10 after exposure and development or any conventional method. The circuit pattern 12 is electroplated with an etching stop layer 13 of 3-10 μm. The etching stop layer 13 is electroplated with a layer of copper electroplating 10'. Then the dry film 11 is removed from the layer of the copper foil 10. Next, the copper foil 10 is heated to become soft. An organic surface layer 14 which includes an optional adhesive layer 141 is attached to the copper electroplating 10' by coating, adhering or compressing. The organic surface layer 14 is then solidified such as by heating or irradiating of ultraviolet light (UV). Moreover, the organic surface 14 can be directly coated on the copper electroplating 10' without the adhesive layer 141. After the layer of the copper foil 10 is etched, the etching stop layer 13 is removed. Finally, the copper electroplating 10' that serves as a conductive circuit is transferred to the organic material, which is on the organic surface layer 14. A surface of the conductive circuit can be further processed with isolation coating, exposure, development, and a contact point surface process, so as to complete functionality of the circuit board.

The notable point is that the organic surface layer 14 used in the present invention is a soft nonmetal organic material layer, hence the organic surface layer 14 is used as a substrate according to the conventional manufacturing process. That is to say, the organic surface layer 14 of the present invention has replaced the carrier of the conventional manufacturing process.

The layer of the copper foil 10 can be completely removed in the aforesaid step of etching the layer of the copper foil 10.

Figure 9A:
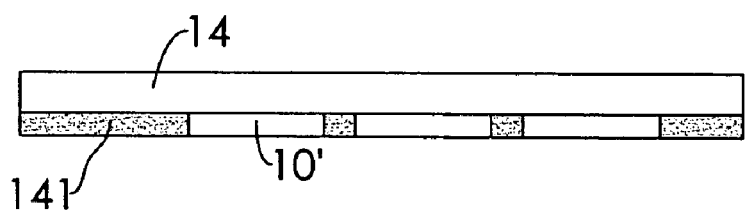
FIG. 9A shows a diagram wherein the etching stop layer on the copper electroplating is removed.
Figure 9B:
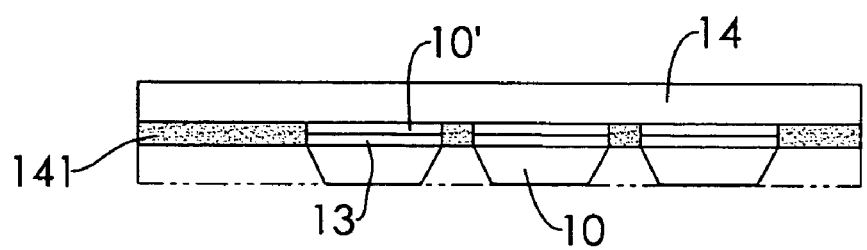
FIG. 9B shows a diagram wherein the layer of the copper foil of FIG. 7 is partially removed.

The layer of the copper foil 10 can be partially removed in the aforesaid step of etching step, so as to leave the copper foil 10 that corresponds to the copper electroplating 10' as shown in FIG. 9B. The remaining copper foil 10 can function as electrode contact points to be coupled with other electrical components.

Figure 7:
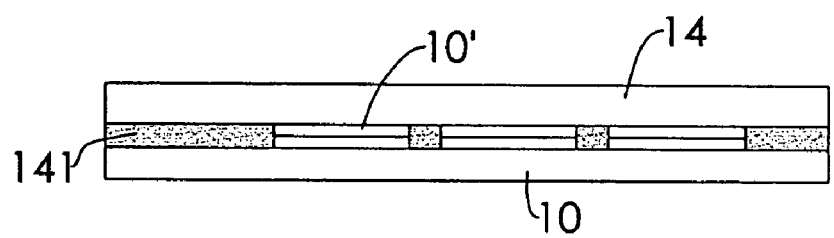
FIG. 7 shows a structure diagram wherein an organic surface layer which includes an adhesive layer is applied to a copper foil layer, and also the organic surface layer is further bonded by copper electroplating.
Figure 8:
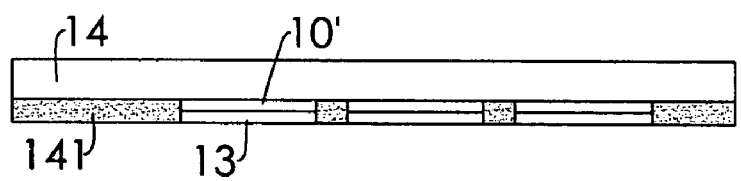
FIG. 8 shows a diagram wherein the layer of the copper foil in FIG. 7 is removed.
Figure 10:
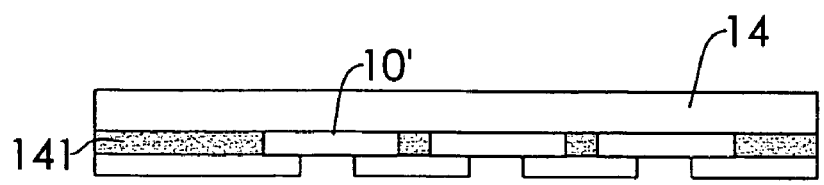
FIG. 10 shows a structure diagram of another example of a preferred embodiment of the present invention.

Referring to FIG. 10, a single side flexible board can be made by coating the structure shown in FIG. 9A or FIG. 9B with an insulating paint or by repeating the step in FIG. 7.

The aforesaid the manufacturing process of the circuit board also can be used to manufacture a double-layered flexible printed circuit with copper on both sides, such as TAB (tape automatic bonding) and COF (chip-on-film) products also like TCP (Tape Carried Package).

The aforesaid manufacturing process of the circuit board can be further proceeded by stacking processes to form a multilayer structure with rigid parts or metal parts. The stacking processes can be performed by well known processes including high density interconnection technology (HDI).

With the aforesaid steps, the manufacturing process of the embedded type flexible printed circuit board of the present invention does not need use of a conventional carrier, so as to greatly reduce costs. Moreover, the circuit board of the present invention can achieve the objectives of the portability and compactness with the structure design of the embedded type flexible printed circuit board.

In conclusion, the manufacturing process of the embedded type flexible printed circuit board of the present invention indeed can improve the conventional drawback of high costs to produce the portable and compact products, and also provides high utilization values to the industry, so as to meet the requirements to apply a new patent.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of an emboss type flexible or rigid printed circuit board, the method comprising the steps of:
    preparing a layer of copper foil;
    coating the layer of the copper foil with a layer of dry film;
    forming a circuit pattern on the layer of the copper foil by etching the dry film;
    electroplating an etching stop layer on the circuit pattern;
    electroplating the etching stop layer with a layer of copper electroplating;
    removing the dry film on the layer of copper foil;
    heating the copper foil to become soft;
    forming an organic surface layer on the copper foil and solidifying the organic surface layer; and
    etching the layer of the copper foil to show the layer of copper electroplating that sever as emboss circuits.

2. The manufacturing method as claimed in claim 1, wherein the layer of the copper foil is completely removed to show the layer of copper electroplating.

3. The manufacturing method as claimed in claim 1, wherein the layer of the copper foil is partially removed, where the layer of the copper foil on the etching stop layer is retained.

4. The manufacturing method as claimed in claim 1, stacking processes are further applied on the emboss circuits to form a multi layer structure with rigid parts or metal parts.

5. The manufacturing method as claimed in claim 1, wherein the organic surface layer is formed on the copper foil by compressing.

6. The manufacturing method as claimed in claim 5, wherein the organic surface layer has an adhesive layer.

7. The manufacturing method as claimed in claim 1, wherein the organic surface layer is formed on the copper foil by coating.

8. The manufacturing method as claimed in claim 7, wherein the organic surface layer has an adhesive layer.

9. The manufacturing method as claimed in claim 7, the organic surface layer is solidified by heating or irradiating of ultraviolet light.

10. The manufacturing method as claimed in claim 1, further comprising:
    removing the etching stop layer after the step of etching the layer of the copper foil.

11. The manufacturing method as claimed in claim 10, wherein the layer of the copper foil is completely removed to show the layer of copper electroplating.

12. The manufacturing method as claimed in claim 10, wherein the layer of the copper foil is partially removed, where the layer of the copper foil on the etching stop layer is retained.

13. The manufacturing method as claimed in claim 10, wherein in the etching stop layer electroplating step, the etching stop layer of 3-10 μm is formed on the circuit pattern.

* * * * *